(12) United States Patent
Kappers et al.

(10) Patent No.: US 9,705,031 B2
(45) Date of Patent: Jul. 11, 2017

(54) SEMICONDUCTOR MATERIAL

(71) Applicant: Intellec Limited, Plymouth (GB)

(72) Inventors: Menno Kappers, Cambridge (GB); Dandan Zhu, Cambridge (GB)

(73) Assignee: Intellec Limited, Plymouth (GB)

( * ) Notice: Subject to any disclaimer, the term of this patent is extended or adjusted under 35 U.S.C. 154(b) by 0 days.

(21) Appl. No.: 14/432,529

(22) PCT Filed: Oct. 2, 2013

(86) PCT No.: PCT/GB2013/052566
§ 371 (c)(1),
(2) Date: Mar. 31, 2015

(87) PCT Pub. No.: WO2014/053831
PCT Pub. Date: Apr. 10, 2014

(65) Prior Publication Data
US 2015/0280058 A1   Oct. 1, 2015

(30) Foreign Application Priority Data

Oct. 2, 2012 (GB) .................................. 1217617.8

(51) Int. Cl.
*H01L 21/033* (2006.01)
*H01L 33/12* (2010.01)
(Continued)

(52) U.S. Cl.
CPC .......... *H01L 33/06* (2013.01); *H01L 21/0251* (2013.01); *H01L 21/0254* (2013.01);
(Continued)

(58) Field of Classification Search
CPC ......... H01L 21/02381; H01L 21/02458; H01L 21/02505; H01L 21/02513; H01L 21/0254; H01L 21/0259; H01L 21/02601; H01L 21/0262; H01L 31/03044; H01L 31/03048; H01L 31/03845; H01L 31/1848; H01L 31/1852; H01L 33/007; H01L 33/0075; H01L 33/12; H01L 33/16; H01L 33/20; H01L 33/32
See application file for complete search history.

(56) References Cited

U.S. PATENT DOCUMENTS

| 2002/0069817 A1 | 6/2002 | Mishra et al. |
| 2005/0037526 A1 | 2/2005 | Kamiyama et al. |

(Continued)

FOREIGN PATENT DOCUMENTS

| GB | WO 2012066269 A1 * | 5/2012 | ....... H01L 21/02381 |
| JP | 2005235909 A | 9/2005 | |

OTHER PUBLICATIONS

Machine English translation of JP2005235909, translated Jun. 8, 2016.*

(Continued)

*Primary Examiner* — Yu Chen
(74) *Attorney, Agent, or Firm* — Senniger Powers LLP (57) ABSTRACT

A semiconductor wafer comprising a substrate; a first AlGaN layer on the substrate; a second AlGaN layer on the first AlGaN layer; a GaN layer on the second AlGaN layer; and a plurality of crystalline GaN islands between the first and second AlGaN layers.

24 Claims, 6 Drawing Sheets

(51) Int. Cl.
*H01L 33/16* (2010.01)
*H01L 31/0304* (2006.01)
*H01L 31/0384* (2006.01)
*H01L 33/06* (2010.01)
*H01L 21/02* (2006.01)
*H01L 31/0352* (2006.01)
*H01L 31/18* (2006.01)
*H01L 33/00* (2010.01)
*H01L 33/32* (2010.01)

(52) U.S. Cl.
CPC .... *H01L 21/0262* (2013.01); *H01L 21/02381* (2013.01); *H01L 21/02458* (2013.01); *H01L 21/02505* (2013.01); *H01L 21/02513* (2013.01); *H01L 31/03044* (2013.01); *H01L 31/03048* (2013.01); *H01L 31/035236* (2013.01); *H01L 31/1848* (2013.01); *H01L 31/1852* (2013.01); *H01L 33/007* (2013.01); *H01L 33/0025* (2013.01); *H01L 33/32* (2013.01)

(56) References Cited

U.S. PATENT DOCUMENTS

2008/0217645 A1   9/2008   Saxler et al.
2009/0315067 A1   12/2009  Huang et al.
2013/0270575 A1   10/2013  Humphreys et al.

OTHER PUBLICATIONS

International Search Report and Written Opinion, PCT/GB2013/052566, dated Nov. 22, 2013, 12 pages.
Häberlen et al., "Dislocation reduction in GaN grown on Si(111) using a strain-driven 3D GaN interlayer", physica status solidi (b), Jul. 2010, vol. 247, Issue 7, pp. 1753-1756.
Abstract of JP2005235909; Sep. 2, 2005.
Great Britain Search Report, GB Application No. 1217617.8, dated Jan. 15, 2013, 1 page.

* cited by examiner

SEMICONDUCTOR MATERIAL

REFERENCE TO RELATED APPLICATIONS

This application is a U.S. national stage application based on PCT/GB2013/052566 filed Oct. 2, 2013, claiming priority to GB application 1217617.8 filed Oct. 2, 2012, the entire disclosures of which are incorporated by reference.

FIELD OF THE INVENTION

The present invention relates to a semiconductor material and the use of a semiconductor material in wafer form as a support for forming a light emitting diode (LED) or other optoelectronic device. Furthermore, the present invention relates to a method of constructing high quality optoelectronic devices using the wafer. In particular, the present invention relates to an improved LED having a silicon substrate that minimises the dislocation-defects and bowing that occur when large support wafers are used.

BACKGROUND OF THE INVENTION

Optoelectronic devices are well known and it is also known that for such devices it is desirable to minimise the occurrence of defects in the semiconductor layers that form part of the structure of the device. Common defects in LEDs, for example, include threading (edge or screw type) dislocations which can lead to a reduced luminescent efficiency in the final product. The efficiency reduction can, at least in part, arise due to non-radiative recombination that can occur at dislocations and defects. These defects reduce the internal quantum efficiency (IQE) of the device.

One cause of such dislocations, as discussed in WO2006/014472, is lattice mismatches between dissimilar layers. This can arise simply due to different lattice parameters and/or due to thermal contraction at different rates following growth at elevated temperatures. A known technique to address the issue of dislocations arising from different lattice parameters and different rates of thermal contraction is to grow compositionally graded layers between two mismatched layers. Thus, the compositionally graded layer can more closely match the lattice parameters required on each interfacing surface. US2010/0032650 discloses such an intervening layer.

Another known technique to reduce the dislocation density is to deposit a discontinuous passivation interlayer of a material, such as $SiN_x$, and then an island growth layer of GaN or InGaN on the $SiN_x$ interlayer to bend the dislocations, followed by a second layer of GaN as disclosed in US2002/0069817. This method usually requires the growth of a thick second layer of GaN to obtain a fully-coalesced continuous low-defect layer.

The present inventors had discovered that the thickness of crack-free GaN layers that can be grown on a silicon substrate is limited and a substantial number of threading dislocations is present in such GaN layers. Furthermore, the inventors realised that any attempt to n-type dope the GaN layer or to include a further n-doped GaN layer on a first GaN layer increases the stress in the layers and exacerbates this problem.

A consequence of the mismatched lattice parameters and thermal expansion coefficients, particularly where the difference lies between the substrate and the overlying layers, is that a high degree of curvature is introduced into the wafer by the mismatch in lattice parameters and thermal expansion coefficients between the substrate and the overlying semiconductor layer. Further, if this curvature means that the overlying layer is in tension then cracks can form in this layer. This curvature also means that large diameter wafers cannot be used in high-volume fabrication facilities and so reduces the size of wafer that can be manufactured cost-effectively or leads to wafers with high defect levels.

Several methods have been proposed to address the issue of tensile stress and associated curvature and/or cracking. Methods include the use of patterned substrates to guide the cracks in masked or etched parts of substrates, the use of compliant substrates or the use of AlGaN layers or the insertion of low-temperature AlN interlayers. To make, for example, GaN-based LEDs on Si substrates by a low-cost route, extra procedures such as ex-situ patterning before growth are not preferred, and a method is required that gives simultaneously crack-free layers, a low threading dislocation density and a flat wafer.

GB2485418 describes a wafer structure that seeks to address at least some of the problems associated with the above-mentioned prior art. The semiconductor material disclosed therein uses a combination of AlGaN layers, GaN layers and SiNx interlayers to provide a high quality material on a silicon substrate for the construction of optoelectronic devices. The wafer is simultaneously flat, crack-free and has an acceptably low dislocation density through careful engineering of the stress in the wafer and control of the threading dislocations. The cost of fabricating the wafer is less than when fabricating a wafer using ex-situ patterning, giving rise to significant commercial advantage.

A key element of the wafer disclosed in GB2485418 was the growth of 3-D islands of GaN through the SiNx interlayers. These islands reduced the propagation of undesirable threading dislocations from the initial nucleation layer into the active regions of the device grown on top of GaN layers grown on top of the 3-D islands. The same inventors subsequently showed that it is possible to grow 3-D islands of GaN directly on the AlN nucleation layer, as described in a published scientific publication (Physics Status Solidi B 247 1752 (2010)). However, it was found that the subsequent growth of AlGaN stress relieving layers introduced additional dislocations that the 3-D island layer was intended to reduce, because the large lattice mismatch between the AlGaN and the GaN. A high aluminium concentration for this AlGaN layer was required in order to provide compositional grading between the AlN nucleation layer and the GaN layers grown above this AlGaN layer. Therefore this particular method disclosed in the above scientific publication is not suitable for the growth of high-quality GaN layers on silicon substrates.

US2005/0037526 discloses a method for the production of a nitride semiconductor wafer. The method relies on the growth of a regular one dimensional array, rather than the growth of isolated crystalline islands.

JP2005235909 discloses a structure intended for short wavelength applications with an active region comprised of GaN and AlGaN. As in US2005/0037526, the structure is grown by external lithographic processing.

US2009/315067 describes a method of reducing the dislocation density without the need for removing the wafer from the growth system as described in the above two applications. The technique described relies on very high levels of doping.

SUMMARY OF THE INVENTION

Accordingly, there is a desire for a semiconductor wafer that addresses at least some of the problems associated with the prior art, or at least to provide a commercially acceptable alternative thereto. In particular, it is an object of the present invention to provide a large wafer without significant bowing. It is also an object of the present invention to provide a low cost silicon-substrate wafer that provides for high efficiency LED production.

According to a first aspect, the present invention provides a semiconductor wafer comprising:
  a substrate;
  a first AlGaN layer on the substrate;
  a second AlGaN layer on the first AlGaN layer;
  a GaN layer on the second AlGaN layer; and
  a plurality of crystalline GaN islands between the first and second AlGaN layers.

BRIEF DESCRIPTION OF THE FIGURES

FIG. 5a shows GaN island growth after 55 s and FIG. 5b is after 525 s on AlGaN on AlN on Si. With longer growth time, the islands are bigger and start to link to each other.

DETAILED DESCRIPTION OF PREFERRED EMBODIMENTS

The present invention will now be described further. In the following passages different aspects/embodiments of the invention are defined in more detail. Each aspect/embodiment so defined may be combined with any other aspect/embodiment or aspects/ embodiments unless clearly indicated to the contrary. In particular, any feature indicated as being preferred or advantageous may be combined with any other feature or features indicated as being preferred or advantageous.

By semiconductor wafer is meant a composite laminar body comprised of at least some semiconductor material. In general terms it is a wafer suitable for the formation of electronic devices, preferably optoelectronic devices. Wafers are well known in the art.

As used herein, the term "on" with respect to two layers includes the layers being in direct contact as well as having one or more layers there-between. The terms "above" or "below" as used herein are relative to a laminar structure wherein the substrate is considered to be the lowest layer. Thus, if a first layer is above a second layer, this means the first layer is on the opposite side of the second layer from the substrate. The terms "above" or "below" as used herein does not require the example first and second layers to be in direct contact with each other.

As used herein, any reference to a species by its constituent components includes all available stoichiometries thereof. Thus, for example, AlGaN includes all alloys thereof, such as $Al_xGa_{(1-x)}N$ wherein x does not equal 1 or 0. Preferred stoichiometries will vary depending on the thickness of the layer required.

The present inventors have now discovered a new method for forming a GaN layer to reduce the formation of the undesirable threading dislocations without the need for SiNx interlayers. Careful control of the initial growth conditions for the GaN islands leads to localised growth of three dimensional domains (or islands) of crystalline regions of GaN protruding above the AlGaN layer (relative to the substrate). When a second AlGaN layer is formed around these three dimensional islands, a proportion of the threading dislocations that form above the AlGaN buffer layer bend towards and terminate at the interface or facets between the three dimensional domains and the second AlGaN layer. Thus, surprisingly, a GaN layer can be formed above the second AlGaN layer having very few threading dislocations other than those that terminate at the above-mentioned interface. As a consequence, the GaN layer of the present invention provides an ideal surface upon which further layers can be formed, such as an n-doped layer, quantum wells or a p-doped layer in, for example, an LED structure. Using this new method the total thickness of the undoped GaN layers can be reduced in comparison to the method using $SiN_x$ interlayers, leading to reduced stress and reduced growth time. Preferably the wafer does not comprise a SiNx interlayer.

In other words, the present inventors have discovered that they can provide a thin GaN layer on even a mismatched substrate, where the GaN layer has a reduced number of threading dislocations. This is the result of using island growth conditions for the growth of GaN islands so as to introduce isolated three-dimensional GaN structures above the first AlGaN layer. Without wishing to be bound by theory, it is believed that the presence of these three dimensional structures (or facetted islands) provides an interface whereby threading defects form half loops after reacting with other threading defects having an opposite Burgers vector. Thus the number of defects in the AlN and first AlGaN layer and in the GaN islands at the AlGaN/GaN interface is high, but the AlGaN and the GaN layers above the islands then have fewer threading defects.

The use of this novel structure provides an upper surface exhibiting a reduced number of threading dislocations. Accordingly, subsequently grown layers will also benefit from a reduced occurrence of these dislocations.

The substrate can be any conventional semiconductor substrate. Suitable substrates include sapphire, SiC, or ZnO, as well as any silicon containing substrate. Preferably the substrate consists essentially of silicon and unavoidable impurities. The use of silicon substrates is especially cost effective.

Preferably the substrate comprises silicon and, preferably, the substrate is silicon (i.e. consists of silicon with unavoidable impurities). The present inventors have discovered that the technique and wafer of the present invention is of particular use when the substrate is silicon. The thickness of the GaN layer required for full coalescence is reduced when using the GaN islands so reducing the total stress build-up in the layer and serving to address the problems of wafer bowing and/or cracking.

When forming a wafer by growth at elevated temperatures, a large tensile/compressive stress (depending on the substrate) is introduced into the film upon cooling from the growth temperature because of large thermal expansion mismatches (for example, it has been found that there is a 46% mismatch between a Si substrate and a GaN layer). The AlGaN layers help to prevent wafer bowing and/or cracks, which otherwise make processing difficult and impair device performance. As the substrate size is scaled up, the requirement of wafer flatness becomes stricter due to the limited tolerance in wafer bow for processing a full wafer. For example, with a 50 μm wafer bow limit, the radius of curvature has to be larger than 6 m for a 2-inch wafer but in excess of 57 m for a 6-inch wafer.

The semiconductor wafer has first and second AlGaN layers. These serve to sandwich the plurality of crystalline GaN islands. Preferably the first AlGaN layer comprises $Al_x(Ga)_{(1-x)}N$, wherein x is in the range $1>x>0.3$; and/or the second AlGaN layer comprises $Al_y(Ga)_{(1-y)}N$, wherein y is in the range $0.7>y>0$, more preferably $0.5>y>0$. Preferably these layers consist of these materials.

The present inventors have discovered that a solution to the problem of combining stress management layers with dislocation reduction is to introduce the GaN 3D island layer into $Al_xGa_{(1-x)}N$ (i.e. between the first and second layers as discussed herein), preferably grown on the AlN nucleation layer. Preferably the $Al_xGa_{(1-x)}N$ is compositionally graded. That is, the first and second AlGaN layers preferably have different Al contents. If the GaN island layer is introduced into the structure in a position where the value of x is large, significant stress is introduced between the AlGaN and the GaN islands. On the other hand, if the GaN is introduced into the AlGaN where the value of x is small it is difficult to grow the GaN layer in the form of islands. There is, therefore, a compromise between introducing the GaN island layer at low and high values of x in the $Al_xGa_{(1-x)}N$. It has been found that the optimum value of x in the first AlGaN layer, should be in the range $0.8>x>0.3$ and preferably in the range $0.6>x>0.4$.

The subsequent $Al_yGa_{1-y}N$ (the second AlGaN layer) preferably has y in the range of $0.5>y>0$, more preferably $0.4>y>0.1$. This range of y helps to minimise the lattice distortion before the growth of the GaN layer, as described herein.

Further careful and extensive investigations have therefore shown an alternative and efficient method for combining stress management layers with dislocation reduction without the need for SiNx interlayers. The present inventors have therefore discovered a new method for forming a three dimensional (3D) GaN layer to reduce the formation of the undesirable threading dislocations without the need for SiNx interlayers. Because most of the dislocations are generated at the interface between the substrate and the initial nucleation layer, the crystalline quality of the upper layers is strongly dependent on the quality of the nucleation layer. The 3D GaN layer described in this invention is effectively a second nucleation layer which reduces the effect of the initial nucleation layer grown directly on the substrate. Moreover, the growth conditions of the 3D GaN layer are much easier to control than those of the initial nucleation layer, presenting a simpler method for the growth of high quality III-nitride films. In particular, this method allows the growth of thicker crack-free GaN layers on silicon substrates when suitable buffer layers are used.

Preferably the first and/or second AlGaN layer is compositionally graded so that the amount of aluminium decreases across the thickness of the layer away from the substrate. More preferably, these layers are graded so that the compositions fall within the above disclosed x and y ranges across their thickness.

In one embodiment, the first AlGaN layer has a fixed concentration of aluminium throughout the thickness of the layer, with a value of x in $Al_xGa_{(1-x)}N$ preferably in the range from more than 0.3 to less than 1.0 (i.e. $03<x<1.0$). The minimum aluminium concentration is determined by the requirement that the first GaN layer formed on the AlGaN buffer layer grows in the form of islands.

In a second embodiment, the first AlGaN layer is compositionally graded so that the concentration of aluminium decreases across the thickness of the layer away from the silicon substrate layer. Thus, the values of x in $Al_xGa_{(1-x)}N$ preferably decrease from 1 across the layer. The minimum aluminium concentration is determined by the requirement that the first GaN layer formed on the AlGaN buffer layer grows in the form of islands, and preferably $x>0.3$. Preferably the decrease is linear, although non-linear or stepwise decreases in the aluminium content are also possible. Where an AlN nucleation layer is used, the use of the compositional grading with the amount of aluminium decreasing across the layer serves to improve the bonding between layers and to introduce compressive stress into the AlGaN layer.

In each of these embodiments, the second AlGaN layer may be of a fixed value or compositionally graded, preferably so that the Al content decreases away from the substrate and is preferably in the ranges discussed above.

The first AlGaN layer between the substrate and the 3D GaN layer, and the second AlGaN layer between the 3D GaN island layer and the GaN layer, control the stress introduced into the semiconductor wafer and allows, for example, an overlying LED structure to be formed on a substrate while minimising the bowing and cracking that would otherwise be produced. This layer serves to address a large lattice and thermal expansion coefficient mismatch between, for example, Si and GaN, which would result in a high dislocation density, bowing and cracking in epitaxially grown GaN, limiting the performance of such LED structures.

Provided between the AlGaN layers is a plurality of crystalline GaN islands. Preferably, in the wafer the plurality of crystalline GaN islands are layered across (upon) the first AlGaN layer. Preferably they form a layer of crystalline GaN islands having a maximum thickness of from 10 to 100 nm, preferably from 20 to 80 nm. That is, the greatest thickness of the layer at any point (i.e. the thickest single crystalline structure), is of from 10 to 100 nm, preferably from 20 to 80 nm.

Preferably the islands of GaN are produced in a substantially even distribution across the layer. This leads to a final wafer having more predictable and useful properties. Preferably each GaN island has a dimension in the plane of the AlGaN/GaN interface of between 10 and 1000 nm, and a dimension perpendicular to the plane of the interface of similar value set by the crystal structure of the island. The density of the islands is preferably in the range $10^8$ to $10^{12}$ cm$^{-2}$, more preferably in the range $10^9$ to $10^{11}$ cm$^{-2}$.

Figure 5:
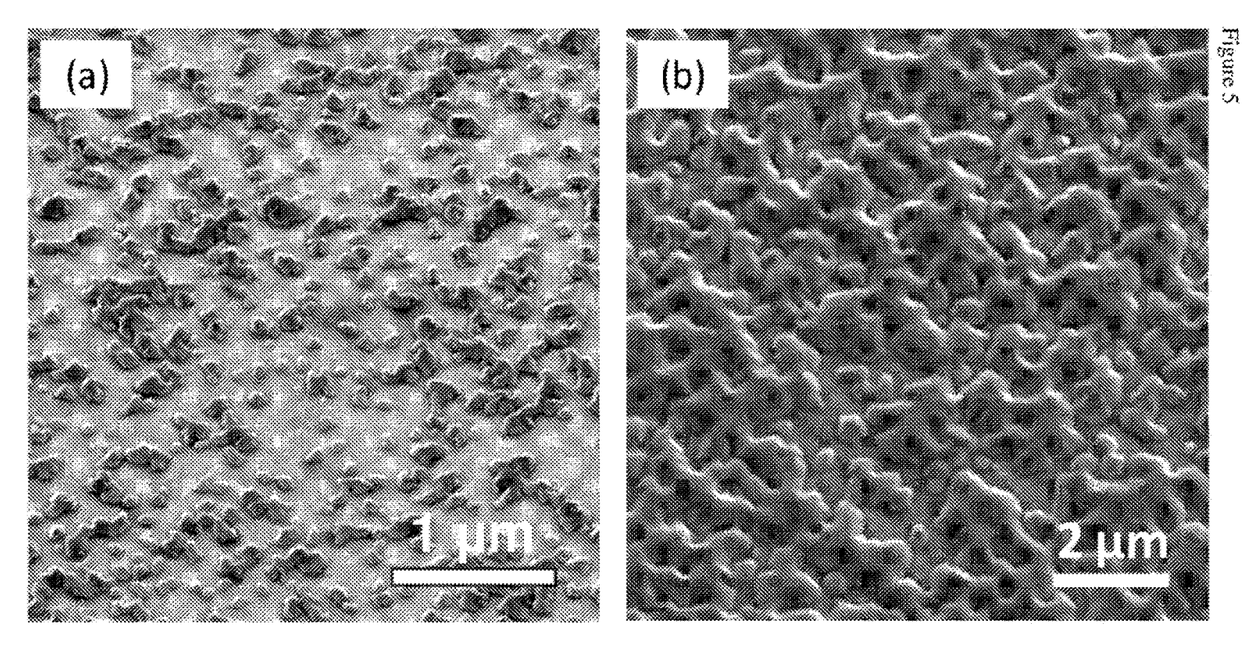
FIG. 5 shows SEM photographs of the island growth, such photographs being suitable for estimating the island density.
Figure 6:
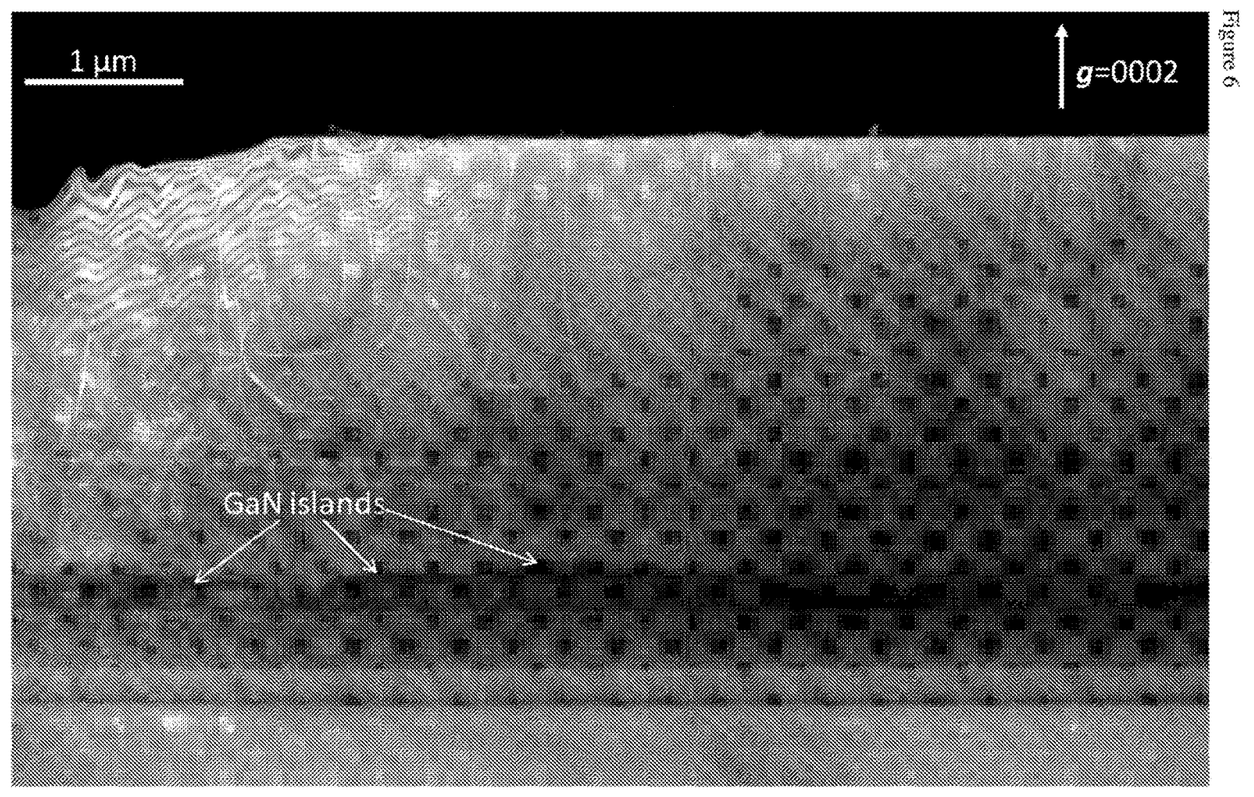
FIG. 6 shows a cross-sectional TEM image of a structure consisting of AlN, a first AlGaN, a GaN "island" layer, a second AlGaN layer and a GaN layer. The GaN islands are labelled. The width of the islands is ~1000 nm.

The growth of the GaN 'island' layer can be easily detected using AFM or scanning electron microscope (SEM). The island density can then be counted per unit area (see FIGS. 5a and 5b). Alternatively, the island can be detected using cross-sectional transmitted electron microscope (TEM) (see FIG. 6). The island density is estimated based on the size of the island. Cross-sectional SEM can also be used for the island detection.

The semiconductor wafer has a GaN layer on the second AlGaN layer.

Preferably the GaN layer is fully coalesced. Under certain growth conditions, the lateral growth rate is higher than the vertical growth rate (which is opposite to island formation), the islands will grow together to form an optically smooth layer. This process is called coalescence. When a smooth film formed, it is called fully coalesced. The coalescence procedure can be measured using in-situ reflectance monitoring equipment during the growth and suitable techniques are well known in the art. At the present time, almost all MOVPE reactors have this monitoring equipment installed.

Preferably the GaN layer is not doped or at least not intentionally doped. This serves to form an insulating region between any n-doped layers formed thereon and the more defective lower layers. It is especially preferred that the GaN of the layer that is formed on the second AlGaN is not doped. This helps to prevent n-type carrier loss and increases the efficiency of a final device.

Preferably the wafer further comprises an n-doped or p-doped GaN layer on the GaN layer. Preferably the n-doped GaN layer is n-doped with Silicon or Germanium. Preferably and in particular the wafer further comprises an n-doped semiconductor layer and/or a p-doped semiconductor layer formed on the wafer structure, i.e. on the GaN layer. Where both n- and p-doped layers are included, one layer is on the other and both are on the GaN layer of the wafer. Preferably the n-doped layer is closest to the GaN layer. When both of these layers are present then a conventional optoelectronic device, such as an LED, can be formed. Suitable n- and p-doped layers are well known in the art.

A preferred n-doped layer is silicon or germanium doped GaN, with this further GaN layer formed directly on the GaN layer. Were a silicon-doped GaN layer to be formed directly on a silicon substrate, due to the high tensile stress introduced by the silicon doping, it would be practically impossible to grow a useful thickness of this low dislocation density n-doped layer without cracking. The wafer of the present invention addresses this problem and allows the growth of such a layer on a silicon substrate with reduced cracking and dislocations in the n-doped layer.

In another implementation, the further n-doped semiconductor layer comprises a compositionally graded Si- or Ge-doped GaN layer formed on the GaN layer so that the amount of Si or Ge respectively increases across the thickness of the layer away from the second GaN layer. That is, there is substantially no silicon doping in the further GaN layer directly adjacent to the GaN layer, and the level of Si-doping increases across the n-doped layer to a maximum at the opposite side from the second GaN layer (at the n/p interface in a conventional LED). Preferably the level of doping varies from $1 \times 10^{17} cm^{-3}$ to $1 \times 10^{19} cm^{-3}$. More preferably the level of doping varies from $1 \times 10^{18} cm^{-3}$ to $8 \times 10^{18} cm^{-3}$.

Preferably there is an AlN layer formed between the substrate layer and the first AlGaN layer. This advantageously acts as a nucleation layer (also known as the initiation layer) to encourage the growth of the AlGaN layer and encourages strong connection of this layer to the substrate. Furthermore, the layer prevents reaction between the overlying layer (in particular the gallium content) and the substrate, especially when the substrate is silicon.

In one embodiment, the wafer further comprises a layer of multiple quantum wells (MQWs) formed on the GaN layer, and wherein the thickness of the layer of MQWs is preferably from 10 to 100 nm. Where the wafer further comprises an n-doped semiconductor layer and/or a p-doped semiconductor layer formed on the wafer, the structure preferably further comprises a layer of multiple quantum wells formed between the n-doped semiconductor layer and a p-doped semiconductor. This is a known technique for increasing the efficiency of an LED and can advantageously be used in combination with the inventive wafer.

Preferably the thickness of the substrate is from 100 to 2000 microns, more preferably from 275 to 1000 microns. These substrates can be obtained commercially. A preferred example is a 6 inch Si substrate of 625 microns from SHE Ltd.

Preferably the thickness of the AlN initiation layer, where present, is from 5 to 400 nm, more preferably from 10-300 nm.

Preferably the total thickness of the first AlGaN layer is from 100 to 1500 nm. More preferably the layer is from 600 to 1200 nm.

Preferably the thickness of the second AlGaN layer is from 50 to 2000 nm and more preferably from 200 and 800 nm. This thickness is sufficient to introduce enough compressive stress into the structure to compensate the tensile stress upon cooling and to ensure a GaN layer with an acceptably low dislocation density. If the layer is too thin then these benefits may not be maximised.

Preferably the thickness of the GaN layer is from 50 to 5000 nm, more preferably 100 nm to 2000 nm. This is a thin layer that, together with the structure disclosed herein provides a low-defect substrate for use in optoelectronics.

Preferably the thickness of each n-doped semiconductor layer, where present, is from 500 to 5000 nanometers, more preferably from 1000 to 2000 nm. This applies equally to the Si- or Ge-doped GaN layer. If the layer is thicker then the likelihood of cracking is increased. In an LED, if the thickness of the n-type GaN is too low the extra resistance of this layer adversely affects the properties of the LED device Preferably the thickness of each p-doped semiconductor layer, where present, is from 50 to 1000 nanometers, more preferably from 50 to 250 nm. P-type semiconductor layers are well known in the art. Mg doping is preferred.

In a preferred embodiment, the semiconductor wafer comprises:
- a silicon substrate;
- an AlN layer on the substrate;
- an $Al_x(Ga)_{(1-x)}N$ layer on the AlN;
- an $Al_y(Ga)_{(1-y)}N$ layer on the $Al_x(Ga)_{(1-x)}N$ layer; and
- a GaN island layer as described herein between the $Al_y(Ga)_{(1-y)}N$ and $Al_x(Ga)_{(1-x)}N$ layers; and
- a GaN layer on the $Al_y(Ga)_{(1-y)}N$ layer;
- wherein x is preferably in the range 1>x>0.3 and y is preferably in the range 0.5>y>0.

According to a second aspect, the present invention provides an LED or a Solar Cell comprising the semiconductor wafer disclosed herein. The semiconductor wafer is especially suited to forming an LED due to the low occurrence of threading dislocations that can be achieved. This increases the IQE of the LED. Furthermore, where larger substrates can be used the costs of process is significantly reduced which is essential for reducing the cost of this fast developing technology.

Preferably the invention relates to a wafer for the production of many small devices. Such a wafer may be quickly and easily produced to minimise production costs. Preferably such a wafer would have a diameter of at least 5 cm, preferably greater than 15 cm. and preferably up to 30 cm. More preferably the wafer is at least 6 inches, preferably at least 8 inches, preferably at least 10 inches at most preferably at least 12 inches. In one embodiment, wafers of <6 inches are preferred. In one embodiment, wafers of ≥6 inches and <8 inches are preferred. In one embodiment, wafers of ≥8 inches and <10 inches are preferred. In one embodiment, wafers of 10 inches and <12 inches are preferred. In one embodiment, wafers of ≥12 inches are preferred. Thus, the wafer can be produced on a large scale. Due to the layers of the present invention the wafer curvature is minimised and larger wafers can be used for increased efficiency. The wafers produced can be divided up to form the individual semiconductor wafers used in devices, such as optoelectronic devices, such as LEDs. For solar cells, in one embodiment, advantageously the wafer is not divided up, but rather substantially the entire wafer is used to form a solar cell.

According to a third aspect, there is provided a process for forming a composite wafer according to any of the preceding claims, wherein the layers are sequentially formed on the substrate using metalorganic vapour phase epitaxy (MOVPE) growth procedure. Preferably at least two or more of the layers are deposited in a single MOVPE process carried out in a single MOVPE chamber. Advantageously, the semiconductor wafer and, optionally, any further layers, can be formed using a single process. This simplifies the manufacturing process and reduces the complexity and cost of producing optoelectronic devices.

The invention will now be described further with reference to a non-limiting example.

In this embodiment GaN structures are grown on either 2-inch or 6-inch Si (111) substrates 5 by metalorganic vapour phase epitaxy (MOVPE) in a 6×2" Aixtron COS reactor using a 6×2" or 1×6" susceptor. Trimethylgallium (TMG), trimethylaluminium (TMA) and trimethylindium (TMI) are used as group-III precursors, while ammonia is used as the nitrogen source.

A Silicon substrate was provided and an AlN nucleation layer was applied with MOVPE. After the formation of a first AlGaN layer, GaN is deposited so that the GaN grows as small islands. The GaN is preferably deposited by using a temperature of from 900 to 1050° C. and a V/III ratio (i.e. the ratio of nitrogen to gallium molar flow rates or partial pressures) of less than 1000:1. Advantageously, the pressure is also increased in accordance with normal MOVPE practice to encourage growth as hexagonal islands having facets to bend the dislocations and prevent them penetrating the GaN layer discussed above. Preferably, on each island, the facets on different sides meet at an acute angle but the islands may also exist in the form of truncated crystals.

Preferably, once the GaN islands have been grown, the second AlGaN layer is grown and allowed to coalesce by increasing the temperature and increasing the V/III ratio above 1000:1, preferably to at least 2000:1 where the ratios refer to the molar flow rates. The increased temperature is preferably above 1050° C.

Furthermore, the MOVPE procedure is preferably carried out in a single chamber and/or in a single process for at least the growth of three layers and preferably for the entire device. Accordingly, to grow each layer in turn, new ingredient components are simply introduced into the growth chamber sequentially, or the growth conditions are changed.

The temperatures required for the growth of each layer can be determined with minimal experimentation. In general terms, it is advantageous to grow the layers at a lower temperature than the optimal growth temperature so as to allow closer control on the layer composition and thickness. By way of example, AlGaN layers can be grown around 1075° C. and GaN layers around 1020° C.

A commercially available Epicurve®TT sensor (Laytec GmbH) was used to give emissivity-corrected real-time temperature and wafer curvature measurement and an Argus (Aixtron) in-situ temperature profiler was installed on top of the reactor to provide a complete temperature map of the wafer. The Argus temperature profiler comprises a multi-element photodiode array in a novel configuration that utilizes an optical path through the reactor showerhead injection tubes. This allows a large number of discrete measurement points from which temperature data regarding wafer and susceptor surfaces can be acquired. Essentially, this allows the measurement of the surface temperature across the whole wafer during growth as the susceptor rotates below the reactor showerhead.

Figure 1:
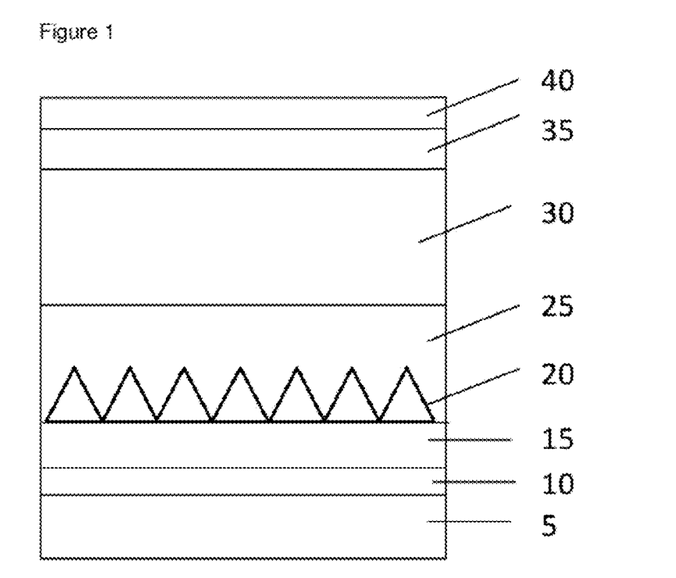
FIG. 1 shows a schematic example of the layer structure of an LED manufactured according to the present invention.

FIG. 1 shows schematically the general layer structure of the semiconductor material described in these two examples of the invention. An AlN nucleation layer 10 is grown on top of the substrate 5, before the growth of the first $Al_xGa_{(1-x)}N$ layer 15 which preferably is compositionally graded with x decreasing from 1.0 to >0.3. Alternatively the $Al_xGa_{(1-x)}N$ layer can be of uniform composition with x in the range 1>x>0.3. A plurality of crystalline GaN islands are grown in a layer 20 in the form of 3D islands on the first $Al_xGa_{(1-x)}N$ layer 15 followed by a coalescence layer 25 of $AlGa_{(1-y)}N$ which preferably is compositionally graded with y decreasing from $y_{max}$ to zero, where $y_{max}$<0.7. Above this layer there is a further GaN layer 30 which is preferably doped n-type, followed by the active region of the device 35 which preferably consists of quantum well structures, and the final-p-type layer 40 to complete the full LED structure. It will be obvious to those skilled in the art that the layer 35 can be complex and can include not only InGaN quantum wells but also AlGaN electron blocking layers, InAlGaN layers and other layers intended to improve device performance.

Figure 2A:
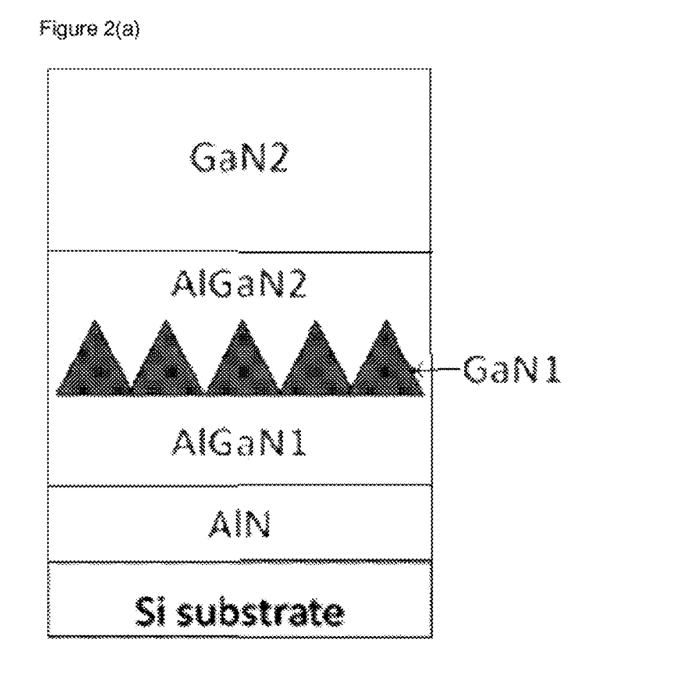
FIG. 2 shows one example of the layers of the semiconductor structure showing the AlN nucleation layer, the first AlGaN layer, the GaN island layer, the second AlGaN layer and the GaN layer, together with a graph of the reflectance and curvature data collected during the growth of the various layers.
Figure 2B:
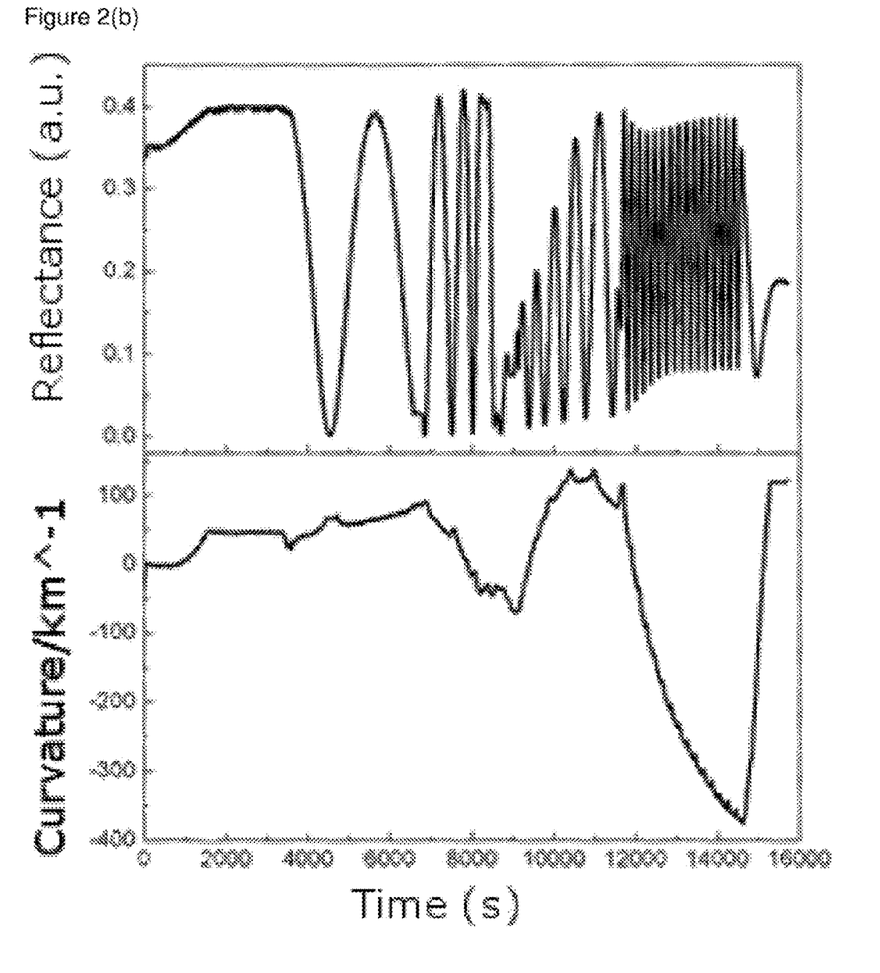

FIG. 2(a) shows schematically the structure of the example 1. A trace of reflectance and the curvature of the wafer (expressed as the inverse of the radius of curvature in km) during the manufacturing process is shown in FIG. 2(b). As can be seen in FIG. 2(b), the curvature of the wafers varies throughout the process.

Between zero and 1800 s, as the substrate was heated to the annealing temperature the curvature increased, reaching a curvature of +35 km$^{-1}$ that remained constant during annealing between 1800 and 3600 s. A positive sign for the curvature indicates concave bow. Then a 200 nm AlN nucleation layer was grown between 2600 and 6500 s which slightly increased the concave form of the wafer. Between 6500 s and 8500 s the $Al_xGa_{(1-x)}N$ buffer layer was grown, with x decreasing from 1.0 to 0.5 away from the substrate and with a total thickness of 350 nm. During this part of the growth, the curvature decreased, becoming slightly convex. The very low amplitude of the oscillations in reflectance just after 8500 s corresponds to the growth of the thin 3D GaN islands on the AlGaN, and this was followed by the growth of a compositionally graded second $Al_xGa_{(1-x)}N$ with x decreasing from 0.5 to 0 away from the substrate over a total thickness of 650 nm. The increasing amplitude of the oscillations in the reflectance indicates coalescence of this AlGaN layer. The growth of this second AlGaN layer between 9000 and 11500 s gave a concave bow but the succeeding growth of the GaN layer of thickness 2000 nm between 11500 and 14500 s gave a large increase in the convex bow. Subsequent cooling of the sample reduced to curvature to give a final curvature of +100 km$^{-1}$ at room temperature. The GaN islands were grown on the first AlGaN layer at a reactor pressure and temperature of 500 torr and 930° C. in a $H_2$ ambient. TMG and $NH_3$ were used as precursors with $H_2$ as carrier gas. The V/III ratio was 380.

Figure 3:
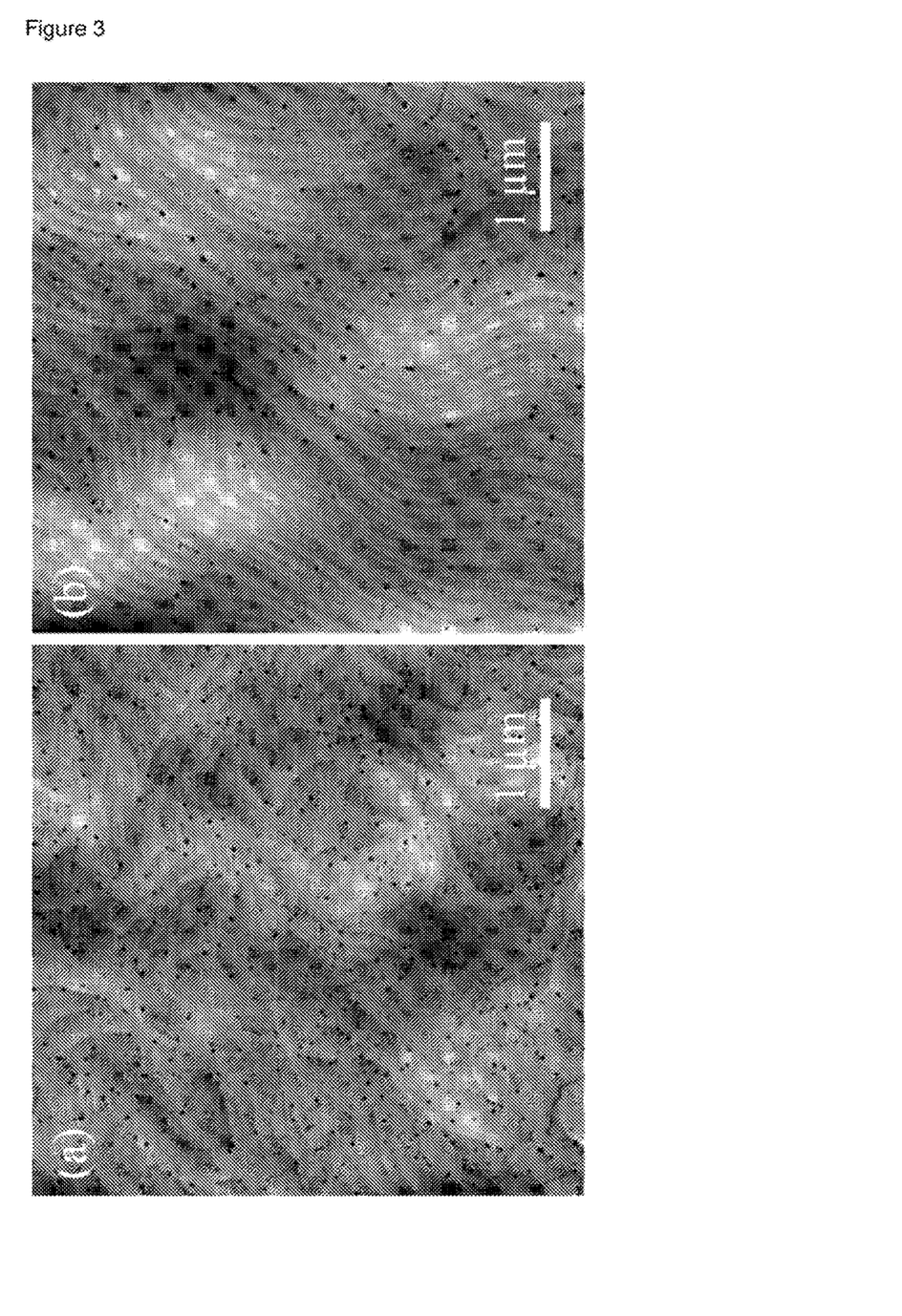
FIG. 3 shows the GaN surface of samples without and with the GaN island layer described in example 1 and FIG. 2.

Because of the large lattice mismatch between Si and III-nitrides, GaN structures grown on Si substrates usually have a high initial dislocation density, which is undesirable for high performance devices. The difficulty of achieving low dislocation density for GaN on Si arises not only from the large lattice mismatch, but also due to the limited thickness of crack-free GaN that can be grown. To reduce the dislocation density, the first GaN layer is in the form of islands which cause the dislocations to bend and to be therefore less likely to penetrate the remainder of the next GaN or AlGaN layers. For comparison, a GaN sample with the same AlN and AlGaN buffer but without GaN island layer for threading dislocation reduction was also grown. FIG. 3 shows the atomic force microscopy (AFM) images of the GaN surface of the samples without (a) and with (b) GaN island layer. The GaN surface has been treated using silane to highlight the pits corresponding to the surface termination of all the threading dislocations. From the AFM images, the improvement of the GaN crystalline quality using the present method is clearly observed.

Figure 4:
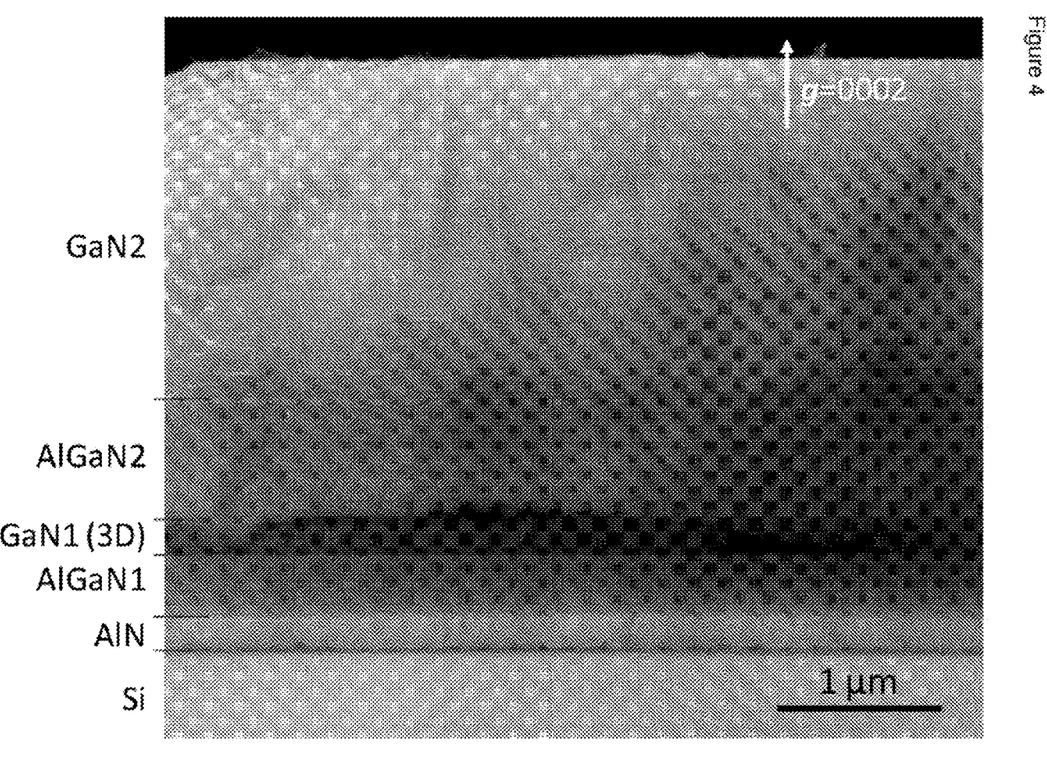
FIG. 4 shows the cross-sectional TEM image of the first example, where the GaN islands are formed on the first AlGaN layer on an AlN nucleation layer.

The formation of the islands can be detected from the reflectance curved collected during the growth. The sudden drop of the reflectance during the first GaN growth on AlN indicates a rough surface due to the island growth mode. The GaN islands can also be detected ex-situ using electron microscopy techniques known in the prior art. FIG. 4 shows the cross-sectional TEM image of a nitride structure with the first GaN layer grown on $Al_{0.5}Ga_{0.5}N$.

More importantly, sufficient compressive stress can still be introduced into the structure when growing the AlGaN and GaN layers on top of the GaN island layer to compensated the tensile stress upon cooling from growth temperature to room temperature. A TD density of $<1\times10^9$ cm$^{-2}$ was obtained on crack-free wafers with GaN layer thickness of ~2 μm. At room-temperature, the wafer is slightly concave bowed and crack-free, suggesting thicker crack-free III-nitride structures can be grown on Si substrates using the growth method presented here.

Advantageously, the present invention allows the growth of crack-free GaN (>2 microns) of low dislocation density on Si substrates. The amount of compressive stress introduced into the AlGaN and GaN layer can be controlled by changing the composition of the AlGaN layer, the thickness of the GaN layer and the position of GaN island layer. As shown in example 1, the GaN island layer is beneficial for both TD density reduction and stress management, which is essential for GaN structures grown on Si substrates. Equally, such layers could be grown on other substrates, especially those where the differences in lattice parameters and thermal expansion coefficients dictate that thicker layers would be prone to wafer bending and cracking of the n-doped layer, or where the diameter of the substrate is large so that low dislocation densities must be combined with a very large wafer radius of curvature.

Furthermore, the growth of GaN on Si substrates usually starts with an AlN nucleation layer. The crystalline quality of this initial AlN nucleation layer is very sensitive to the reactor condition and has strong influence on the crystalline quality of the III-nitride layers grown on top.

In the present invention, the first GaN island layer grown on the AlGaN buffer layer behaves as a second nucleation layer which reduces the effect of the initial nucleation layer grown directly on the substrate. Compared with the AlN nucleation layer, the growth conditions of the 3D GaN layer are much easier to control, and therefore presenting a simpler and more robust method for the growth of high quality III-nitride films on foreign substrates. It has also been found that the GaN structure grown using the method described in this invention is much less likely to crack even with a high concave bow.

The wafer produced with the structure disclosed herein was compared to one produced according to the method of Haberlen et al (2010) *Phys. Status. Solidi B* 247 1753. As shown in the table below, the dislocation density was reduced and the curvature was also minimised.

| Crystalline quality/defect density | | Prior Art | Inventive sample |
|---|---|---|---|
| FWHM of XRD | GaN (004) | 890 arcsec | 503 arcsec |
| | GaN (101) | 2330 arcsec | 895 arcsec |
| Threading dislocation density (cm$^{-2}$) | | $9.5 \times 10^9$ | $1.1 \times 10^9$ |

Although preferred embodiments of the invention have been described herein in detail, it will be understood by those skilled in the art that variations may be made thereto without departing from the scope of the invention or of the appended claims.

The invention claimed is:

1. A semiconductor wafer, for use as a support for forming a light emitting diode, comprising:
   a silicon substrate;
   an AlN layer on and in direct contact with the silicon substrate;
   an $Al_x(Ga)_{(1-x)}N$ layer on and in direct contact with the AlN layer, wherein x is in the range of 1>x>0.3;
   an $Al_y(Ga)_{(1-y)}N$ layer on the $Al_x(Ga)_{(1-x)}N$ layer;
   a GaN layer on and in direct contact with the $Al_y(Ga)_{(1-y)}N$ layer; and
   a plurality of crystalline GaN islands on and in direct contact with the $Al_x(Ga)_{(1-x)}N$ layer and between the $Al_x(Ga)_{(1-x)}N$ and $Al_y(Ga)_{(1-y)}N$ layers.

2. The semiconductor wafer according to claim 1, wherein y is in the range 0.5>y>0.

3. The semiconductor wafer according to claim 1, wherein the plurality of crystalline GaN islands are layered across the $Al_x(Ga)_{(1-x)}N$ layer.

4. The semiconductor wafer according to claim 3, wherein the layer of crystalline GaN islands has a maximum thickness of from 10 to 100 nm.

5. The semiconductor wafer according to claim 3, wherein the plurality of crystalline GaN islands have a density of from $10^8$ to $10^{12}$ cm$^{-2}$.

6. A semiconductor wafer according to claim 1, wherein the GaN layer is fully coalesced.

7. The semiconductor wafer of claim 1, wherein the $Al_x(Ga)_{(1-x)}N$ layer is compositionally graded so that the amount of aluminum decreases across the thickness of the layer away from the substrate.

8. The semiconductor wafer of claim 1, wherein the GaN layer is not doped.

9. A semiconductor wafer according to claim 1, wherein the wafer further comprises an n-doped or p-doped GaN layer on the GaN layer.

10. The semiconductor wafer according to claim 9, wherein the n-doped GaN layer is n-doped with Silicon or Germanium.

11. The semiconductor wafer of claim 10, further comprising a layer of multiple quantum wells (MQWs) formed on the GaN layer, and wherein the thickness of the layer of MQWs is preferably from 10 to 100 nm.

12. The semiconductor wafer of claim 1 wherein the thickness of the substrate is from 275 to 1000 µm.

13. The semiconductor wafer of claim 1, wherein the wafer has a diameter of at least 6 inches.

14. An LED or a Solar Cell comprising the semiconductor wafer of claim 1.

15. The semiconductor wafer according to claim 1, wherein:
the wafer does not comprise a SiNx interlayer.

16. The semiconductor wafer of claim 1, wherein the $Al_y(Ga)_{(1-y)}N$ layer is compositionally graded so that the amount of aluminium decreases across the thickness of the layer away from the substrate.

17. The semiconductor wafer of claim 1 wherein the thickness of the AlN layer is from 10 to 300 nm.

18. The semiconductor wafer of claim 1 wherein the thickness of the $Al_x(Ga)_{(1-x)}N$ layer is from 100 to 1500 nm.

19. The semiconductor wafer of claim 1 wherein the thickness of the $Al_y(Ga)_{(1-y)}N$ layer is from 50 to 2000 nm.

20. The semiconductor wafer of claim 1 wherein the thickness of the GaN layer is from 50 to 5000 nm.

21. The semiconductor wafer of claim 1 consisting of the silicon substrate, the AlN layer on and in direct contact with the silicon substrate, the $Al_x(Ga)_{(1-x)}N$ layer on and in direct contact with the AlN layer, the $Al_y(Ga)_{(1-y)}N$ layer on the $Al_x(Ga)_{(1-x)}N$ layer, the GaN layer on and in direct contact with the $Al_y(Ga)_{(1-y)}N$ layer; and the plurality of crystalline GaN islands on and in direct contact with the $Al_x(Ga)_{(1-x)}N$ layer and between the $Al_x(Ga)_{(1-x)}N$ and $Al_y(Ga)_{(1-y)}N$ layers.

22. The semiconductor wafer of claim 1 wherein x is in the range 0.6>x>0.4 and y is in the range 0.4>y>0.1.

23. A process for forming a semiconductor wafer comprising sequentially forming the following layers and islands on a silicon substrate using metalorganic vapour phase epitaxy (MOVPE) growth procedure:
an AlN layer on and in direct contact with the silicon substrate;
an $Al_x(Ga)_{(1-x)}N$ layer on and in direct contact with the AlN layer, wherein x is in the range of 1>x>0.3;
an $Al_y(Ga)_{(1-y)}N$ layer on the $Al_x(Ga)_{(1-x)}N$ layer;
a GaN layer on and in direct contact with the $Al_y(Ga)_{(1-y)}N$ layer; and
a plurality of crystalline GaN islands on and in direct contact with the $Al_x(Ga)_{(1-x)}N$ layer and between the $Al_x(Ga)_{(1-x)}N$ and $Al_y(Ga)_{(1-y)}N$ layers.

24. The process according to claim 23, comprising depositing at least two of the layers in a single MOVPE process carried out in a single MOVPE chamber.

* * * * *